(12) United States Patent
Brouillette et al.

(10) Patent No.: US 6,394,334 B1
(45) Date of Patent: May 28, 2002

(54) METHOD AND APPARATUS FOR FORMING SOLDER BUMPS

(75) Inventors: Guy Paul Brouillette, Quebec (CA); Peter Alfred Gruber, Mohegan Lake; Frederic Maurer, Valhalla, both of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/536,810

(22) Filed: Mar. 28, 2000

Related U.S. Application Data (62) Division of application No. 09/070,121, filed on Apr. 30, 1998, now Pat. No. 6,056,191.

(51) Int. Cl.⁷ ................................................. B23K 1/00
(52) U.S. Cl. ........................................ 228/33; 228/215
(58) Field of Search ...................... 228/33, 254, 56.3, 228/253, 180.22, 180.21, 215, 262.1

(56) References Cited

U.S. PATENT DOCUMENTS

| | | | |
|---|---|---|---|
| 4,906,823 A | | 3/1990 | Kushima et al. |
| 5,244,143 A | * | 9/1993 | Ference et al. ......... 228/180.21 |
| 5,388,327 A | * | 2/1995 | Trabucco ..................... 29/830 |
| 5,478,700 A | | 12/1995 | Gaynes et al. |
| 5,535,936 A | | 7/1996 | Chong et al. |
| 5,551,148 A | | 9/1996 | Kazui et al. |
| 5,718,367 A | | 2/1998 | Covell, II et al. |
| 5,775,569 A | * | 7/1998 | Berger et al. ............... 228/254 |
| 5,868,305 A | | 2/1999 | Watts, Jr. et al. |
| 5,894,985 A | | 4/1999 | Orme-Marmarelis et al. |

* cited by examiner

Primary Examiner—M. Alexandra Elve
(74) Attorney, Agent, or Firm—Robert M. Trepp; Randy W. Tung (57) ABSTRACT

The present invention discloses a method and apparatus for forming solder bumps by a molten solder screening technique in which a flexible die head constructed of a metal sheet is utilized for maintaining an intimate contact between the die head and a solder receiving mold surface, The flexible die head, when used in combination with a pressure means, is capable of conforming to any curved mold surface as long as the curvature is not more than 2.5 μm per inch of die length. The present invention further provides a method and apparatus for filling a multiplicity of cavities in a mold surface by providing a stream of molten solder and then intimately contacting the surface of the molten solder with a multiplicity of cavities such that the molten solder readily fills the cavities. The apparatus further provides means for removing excess molten solder from the surface of the mold without disturbing the molten solder already filled in the cavities. The present invention further discloses a flexible die for dispensing molten solder consisting of a die body that is constructed of a metal sheet capable of flexing of not less than 1.5 μm per inch of die length, a gate opening for receiving a supply of molten solder, a slot opening for dispensing the molten solder onto a solder receiving surface, and a pressure means associated with the die body for providing adequate pressure such that the die body intimately contacting the solder receiving mold surface.

8 Claims, 5 Drawing Sheets

METHOD AND APPARATUS FOR FORMING SOLDER BUMPS

This is a divisional appl. of Ser. No. 09/070,121, filed May 30, 1998, now U.S. Pat. No. 6,056,191.

FIELD OF THE INVENTION

The present invention generally relates to a method and apparatus for forming solder bumps on an electronic structure and more particularly, relates to a method and apparatus and method for forming solder bumps on a semiconductor chip by a molten solder screening technique.

BACKGROUND OF THE INVENTION

In modern semiconductor devices, the ever increasing device density and decreasing device dimensions demand more stringent requirements in the packaging or interconnecting techniques of such devices. Conventionally, a flip-chip attachment method has been broadly used in the packaging of IC chips. In the flip-chip attachment method, instead of attaching an IC die to a lead frame in a package, an array of solder balls is formed on the surface of the die. The formation of the solder balls is normally carried out by an evaporation method of lead and tin through a mask for producing the desired alloy balls. More recently, the technique of electro-deposition has been used to produce the solder balls in flip-chip packaging.

Other solder ball formation techniques that are capable of solder-bumping a variety of substrates have also been proposed. These techniques work fairly well in bumping semiconductor substrates that contain solder structures over a minimum size. One of the more popularly used techniques is a solder paste screening technique which can be used to cover the entire area of an 8 inch wafer. However, with the recent trend in the miniaturization of device dimensions and the reduction in bump-to-bump spacing (or pitch), the solder paste screening technique has become impractical. For instance, one of the problems in applying solder paste screening technique to modern IC devices is the paste composition itself. A paste is generally composed of a flux and solder alloy particles. The consistency and uniformity of the solder paste composition therefore become more difficult to control with a decreasing solder bump volume. A possible solution for this problem is the utilization of solder pastes that contain extremely small and uniform solder particles. However, this can only be done at a high cost penalty. Another problem in using the solder paste screening technique in modem high density devices is the reduced pitch between bumps. Since there is a large reduction in volume from a screened paste to the resulting solder bump, the screen holes must be significantly larger in diameter than the final bumps. Thus stringent dimensional control of the bumps makes the solder paste screening technique impractical for applications in high density devices.

A more recently developed injection molded solder (IMS) technique attempted to solve these problems by dispensing molten solder instead of solder paste. However, problems have been observed when the technique is implemented to wafer-sized substrates, U.S. Pat. No. 5,244,143, assigned to the common assignee of the present invention, discloses the injection molded solder technique and is hereby incorporated by reference in its entirety. One of the advantages of the injection molded solder technique is that there is very little volume change between the molten solder and the resulting solder bump. The IMS technique teaches the use of a two inch wide head that fills boro-silicate glass molds that are wide enough to cover most single chip modules. A narrow wiper provided behind the solder slot passes the filled holes once to remove excess solder. However, when a two inch wide head is used to fill molds for large wafers, i.e., such as an 8 inch or 12 inch wafer, the fill requires at least four or six successive scans by the head. During such successive scans, the overlapped areas between scans inevitably have degraded fill characteristics such as solder streaks between holes and non-uniform fills.

Another disadvantage of the IMS technique is the mold flatness and the head flatness. The boro-silicate glass molds used are typically thin enough to allow some flexibility over a length of 8 or 10 inches. At a typical thickness of $\frac{1}{16}$", the large scale flexibility of the mold causes the mold to conform to the contour of the support-plate that holds the mold. During a relatively fast heating and cooling of the support-plate in the solder-fill process, the support-plate deforms over a large wafer-sized area. Under the IMS head pressure, the mold conforms to the support-plate contour and therefore becomes curved over its entire width. When compressed by a rigid IMS head, there is a high likelihood that a gap will be formed between the head and the mold. The gap causes poor wiping of excess solder from the mold surface resulting streaking and poor filling problems. Furthermore, the IMS technique requires vacuum to induce a solder flow by generating a negative pressure at the leading edge of the solder slot. The molten solder will leak into the vacuum slot when the gap between the vacuum and the solder slot is larger than a maximum allowable value, typically 5 $\mu$m. Moreover, when both the mold and the head are made of glass material, the friction generated by glass sliding on glass causes a significant drag on the scanning head. Any hard debris on the mold surface may also cause significant damage to the mold.

It is therefore an object of the present invention to provide a method for forming solder bumps by a molten solder screening technique that does not have the drawbacks and shortcomings of the conventional solder bumping techniques.

It is another object of the present invention to provide a method for forming solder bumps by a molten solder screening technique that does not require the use of a vacuum source and a vacuum slot in the mold head.

It is a further object of the present invention to provide a method for forming solder bumps by a molten solder screening technique wherein a molten solder die of sufficient length to cover the entire area of a large wafer is used.

It is another further object of the present invention to provide a method for forming solder bumps by a molten solder screening technique in which a flexible die head capable of conforming to an uneven mold surface is used.

It is still another object of the present invention to provide a method for forming solder bumps by a molten solder screening technique in which fresh, un-oxidized molten solder is used for each mold fill.

It is yet another object of the present invention to provide a method for forming solder bumps by a molten solder screening technique in which a pressure means is used in combination with a flexible die to accommodate glass molds with large curvatures.

It is still another further object of the present invention to provide an apparatus for forming solder bumps by a molten solder screening technique in which a mechanical support means is used for engaging a mold with a flexible die such that a predetermined pressure is maintained between the mold cavities and the surface of a molten solder stream.

It is yet another further object of the present invention to provide an apparatus for forming solder bumps by a molten solder screening technique wherein an excess solder removal means is used to remove excess molten solder from the surface of the mold.

It is still another further object of the present invention to provide an apparatus for forming solder bumps by a molten solder screening technique in which a mold constructed of a material that has a coefficient of thermal expansion substantially similar to that of silicon or the final solder receiving material is used.

SUMMARY OF THE INVENTION

The present invention discloses a method and apparatus for forming solder bumps by a molten solder screening technique in which a flexible die member is used in combination with a pressure means to enable the die member to intimately engage a mold surface and thus filling the mold cavities for forming the solder bumps.

In a preferred embodiment, a method for filling a multiplicity of cavities positioned in the surface of a substrate with molten solder is provided which can be carried out by the steps of first providing a stream of molten solder, then passing the multiplicity of cavities in the surface of the substrate in intimate contact with the surface of the molten solder stream, the contact is adjusted such that molten solder in the stream exerts a pressure against the surface of the substrate so as to fill the multiplicity of cavities with the molten solder, and then removing the excess molten solder from the surface of the substrate. One of such suitable substrates is a mold.

The present invention is also directed to an apparatus for filling a multiplicity of cavities positioned in the surface of a substrate with a molten solder which includes a stream of molten solder, a mechanical support means for engaging the multiplicity of cavities in the surface of the substrate with a surface of the stream such that a predetermined pressure is maintained between the multiplicity of cavities and the stream surface, and a solder removal means for removing excess molten solder from the surface of the substrate.

In another preferred embodiment, a method for forming a multiplicity of solder bumps on the surface of an electronic device is provided which can be carried out by the operating steps of first providing a substrate that has a multiplicity of cavities in a top surface, then providing a stream of molten solder, then passing the multiplicity of cavities in the surface of the substrate over and intimate contacting the surface of the stream of molten solder, the contact can be adjusted such that molten solder in the stream exerts a pressure against the surface of the substrate so as to fill the multiplicity of cavities with the molten solder, then removing the excess molten solder from the surface of the substrate and allowing the molten solder in the multiplicity of cavities to solidify, then contacting and transferring the solder bumps in the multiplicity of cavities with and to a solder receiving surface of an electronic device.

The present invention is further directed to a die for dispensing molten solder that includes a die body of elongated shape formed of a metal sheet non-wetting to solder capable of flexing of no less than 1.5 $\mu$m per inch of die length, the die body has a front side and a back side, a gate opening through the front and back sides of the die body for receiving molten solder from a reservoir, an elongated slot opening in the front side of the die body in fluid communication with the gate opening for distributing molten solder to a solder receiving surface, and a pressure means mounted on the back side of the die body for providing pressure to the die body such that the die body intimately contacts the solder receiving surface.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENTS

The present invention discloses a method and apparatus for forming solder bumps by a molten solder screening technique in which a flexible die head is pressed against a mold surface by a pressure means for achieving an intimate contact between a die opening and a multiplicity of cavities in the surface of the mold. The flexible die head also serves a desirable function of a wiper by utilizing its trailing edge as a removal means for removing excess molten solder from the surface of the mold.

The present invention also provides a method for filling a multiplicity of cavities in the surface of a mold with molten solder by providing a stream of molten solder and then passing a multiplicity of cavities in the mold surface in contact with the surface of the stream by adjusting a contact force such that the molten solder in the stream exerts a pressure against the surface of the mold to fill the cavities with solder and then removing excess solder from the surface of the mold. The stream of molten solder is supplied through a die head constructed of a flexible metal sheet that is capable of flexing at least 1.5 $\mu$m per inch of die length. The stream of molten solder has a composition between about 58% tin/42% lead and about 68% tin/32% lead. The multiplicity of cavities each has a depth-to-width aspect ratio of between about 1:1 and about 1:10. The mold body is made of a material that has a coefficient of thermal expansion substantially similar to that of silicon or the final solder receiving material. The contact between the multiplicity of cavities and the surface of the molten solder stream can be adjusted by a pressure means exerted on the flexible die.

The present invention also discloses an apparatus which can be used to fill a multiplicity of cavities in a mold surface by a molten solder which includes a stream of molten solder. a pressure means (or a mechanical support device) for engaging the multiplicity of cavities in the surface of the mold with a surface of the stream such that a predetermined pressure is maintained between the multiplicity of cavities and the surface of the stream, and a solder removal means for removing excess molten solder from the surface of the mold. The apparatus may further include a flexible die member for flowing the stream of molten solder therethrough. The solder removal means for removing excess solder from the surface of the mold is a wiper formed by the trailing edge of the flexible die.

The present invention further discloses a method for forming a multiplicity of solder bumps on the surface of an electronic device by first providing a mold that has a multiplicity of cavities formed in a top surface and contacting the cavities with a flexible die head through which a stream of molten solder flows, and then filling the cavities with the molten solder and transferring the solder bumps to a solder receiving surface on an electronic device by intimately contacting the multiplicity of cavities with the solder receiving surface and heating to a reflow temperature of the solder. The stream of molten solder is provided at a pressure of not less than 2 psi. The solder receiving surface of the electronic device may be a surface of a semiconductor chip having bond pads formed thereon.

The present invention further provides a die for dispensing molten solder that is constructed of a die body of elongated shape formed of a metal sheet capable of flexing of not less than 1.5 $\mu$m per inch of die length, the die body has a gate opening and an elongated slot opening to allow a molten solder to flow therethrough, and a pressure means mounted on the back side of the die body for providing pressure to the die body and forming an intimate contact with a solder mold. The pressure means may be a plurality of springs that are mounted in a perpendicular direction to the elongated die body, or a plurality of bellows that are mounted in a perpendicular direction to the elongated die body. The die body further includes a trailing edge acting as a wiper for removing excess molten solder from the solder mold.

Figure 1A:
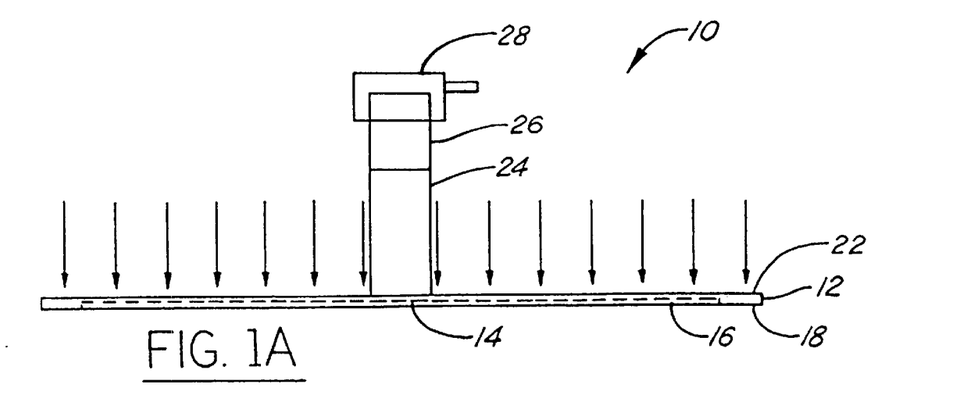
FIG. 1A is a schematic illustrating the present invention flexible die head in a side view.

Referring now to FIG. 1A, wherein a present invention flexible die head 10 for forming solder bumps by a molten solder screening process is shown. The die head 10 has a die body 12 which is made of a thin, flexible metal sheet such as stainless steel or any other suitable material non-wetting to solder. The die body 12 has a gate opening 14 and a slot opening 16. The gate opening 14 has a narrow width and is generally positioned at the center of the die body 12. The gate opening 14 provides fluid communication between a front side 18 of the die body 12 and a back side 22 of the die body 12. The gate opening 14 further provides a passageway for receiving a molten solder 24 stored in a solder reservoir 26. The molten solder 24 is kept under an inert gas atmosphere at a pressure of approximately 5 psi. A suitable inert gas used is nitrogen, i.e., as shown in FIG. 1A, supplied by a nitrogen source 28. The functions of the inert gas in the solder reservoir are two fold. First, it provides an inert gas blanket over the solder 24 such that any oxidation of the molten solder 24 can be avoided. Secondly, the nitrogen blanket in the reservoir 26 provides a positive pressure such that molten solder 24 flows easily through the gate opening 14 into the slot opening 16. In continuous operation, the nitrogen pressure is turned off when flexible die head 10 moves between molds to prevent solder loss. The slot opening 16 is provided in the front surface 18 of the die body 12 in a suitable depth such that molten solder 24 can easily flow into the mold cavities 32 (shown in FIG. 2). The width of the slot opening 16 is predetermined such that it covers substantially all the cavities 32, 38 in the mold surface 42. The opening 16 is also wide enough to cover the entire width of a wafer surface to be later bumped by first filling a mold surface having the same width.

Figure 1B:
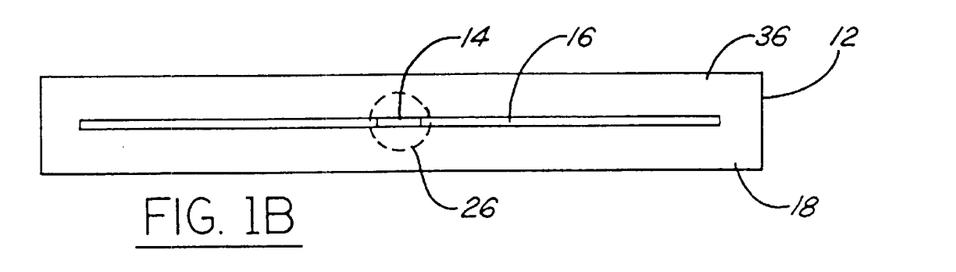
FIG. 1B is a schematic illustrating the present invention die head in a bottom view.
Figure 2:
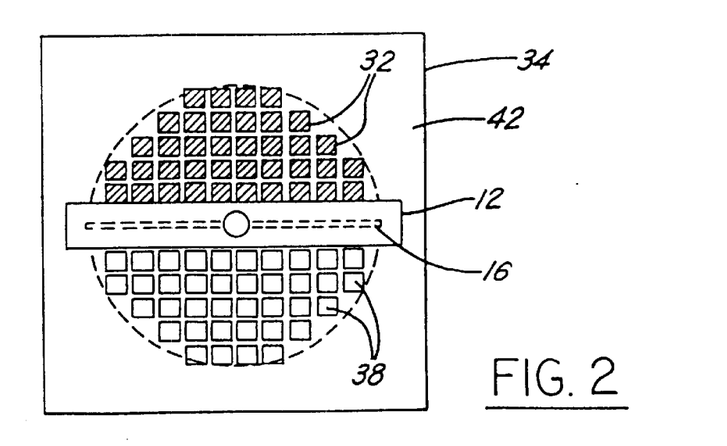
FIG. 2 is a schematic illustrating the present invention die head positioned over a wafer-sized mold.

The die body 12 also functions as a high temperature squeegee which separates the molten solder in the slot opening 16 from the molten solder filled in the mold cavities 32 (FIG. 2). In order to accomplish this task, the die body 12 must be positioned closely behind a molten solder flow front when the flow front completely covers a linear area across the mold surface 42. The aspect ratio (the depth-to-width ratio) of the mold cavities 32 are typically 0.5 so that solder flows easily into and penetrates to the bottom of the cavity. It has been noted in the present invention novel method that, at this point, it is critical to "cut" or "sever" the molten solder as the mold plate 34 scans over the molten solder flow. This difficult task is accomplished by the present invention flexible die body 12 in a unique unexpected manner since the trailing edge 36 of the die body 12 functions as a flexible wiper, or squeegee, to continuously scrape the surface 42 of the mold plate 34. FIG. 1B illustrates a bottom View of the flexible die head 10 shown in FIG. 1A. The trailing edge 36 of the die body 12 therefore effectively "cuts" the solder supply 24 from the molten solder that has already been deposited in the mold cavities 32. The trailing edge 36, should be sufficiently smooth to assure a uniform contact across the optically-smooth mold surface 42. It is yet another unique unexpected discovery in the present invention method that the trailing edge 36, or the wiper, of the die body 12 is flexible only on a global scale, i.e. on a scale of the width of the mold plate 34. As a result, the trailing edge 36 does not enter into cavities 32 and damage the solder bumps formed in the cavities. The word "flexibility" used in the context of the present invention is on the scale of inches, while the word "rigidity" used in the context of the present invention is on the scale of thousandths of an inch or mils.

As shown in FIG. 2, the present invention flexible die body 12 scans smoothly over the surface 42 of the mold plate 34, i.e., over the top of all the cavities 32 allowing the solder within the cavities to stay while removing excess solder from the surface 42. This operation continues as the mold plate 34 is scanned over the molten solder supply 24 until all the cavities are filled. As shown in FIG. 2, the cavities 38 not yet scanned over die body 12 are still empty. The present invention novel method only requires the die body 12 to pass over the mold plate 34 once for a complete fill. The novel process therefore eliminates solder streaking and non-uniform fill problems caused by multiple scannings with overlapped areas encountered in conventional methods.

Figure 3A:
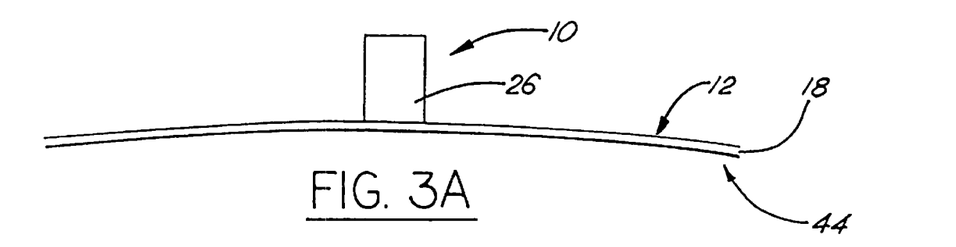
FIG. 3A is a schematic showing the present invention flexible die head engaging a convex mold surface.
Figure 3B:
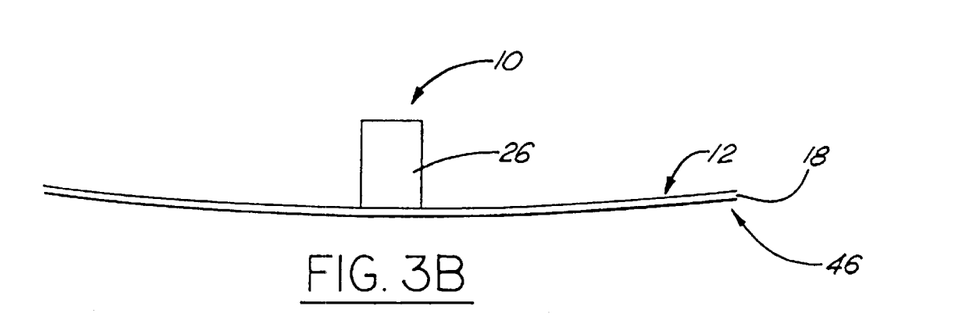
FIG. 3B is a schematic illustrating the present invention flexible die head engaging a concave mold surface.
Figure 3C:
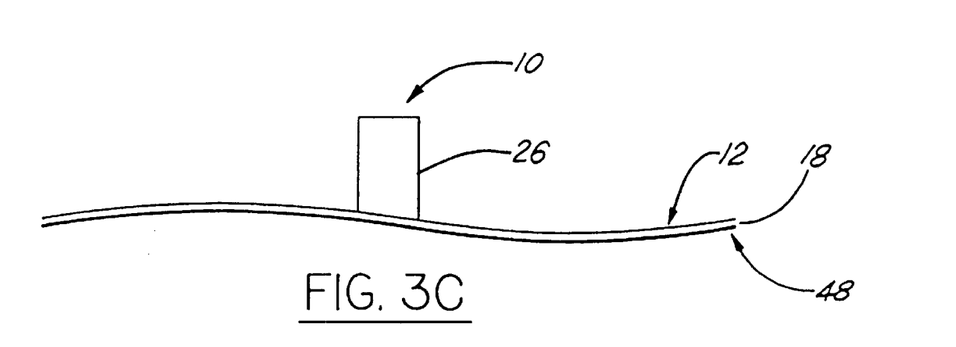
FIG. 3C is a schematic illustrating the present invention flexible die head engaging a complex-shaped mold surface.

Referring now to FIGS. 3A–3C, wherein the present invention flexible die head 10 is shown fitted to various contoured molds 44, 46 and 48. The details of the flexible die head 10, i.e., the gate opening, the slot opening and the trailing edge (or wiper) are not shown for simplicity reasons. The mold 44, 46 and 48 are also shown greatly simplified with only the mold surfaces shown. For instance, FIG. 3A shows a convex-shaped mold surface on mold 44, FIG. 3B shows a concave-shaped mold surface on mold 46 and FIG. 3C shows a complex-shaped mold surface for mold 48. FIGS. 3A, 3B and 3C therefore demonstrates the desirable characteristic of the present invention novel flexible die head 10 of its capability to conform to any curved mold surface, as long as the curvature is within an allowable maximum value. It has been found that, with the proper pressure means (not shown in FIGS. 3A–3C), the present invention novel flexible die head 10 is capable of flexing to not less than 1.5 $\mu$m per inch of die length, and preferably to not less than 2.5 $\mu$m per inch of die length. The surface 18 of the flexible die head 10 should be sufficiently smooth in order to assure an uniform contact across an optically-smooth mold surface. It should again be emphasized that the die head is flexible only on a global scale, as previously defined, over the width of the mold. It remains rigid on a local scale such that it does not enter into individual cavities in the surface of the mold. As previously defined, the word "flexibility" as used in the present application is on the scale of inches, while the word "rigidity" as used in the present application is on the scale of mils. The present invention novel flexible die head 10 is therefore capable of completely tracking and linearly matching a mold curvature (within a maximum allowable curvature) as the die head scans across the surface of a mold, regardless of the shape of the mold curvature.

Figure 4A:
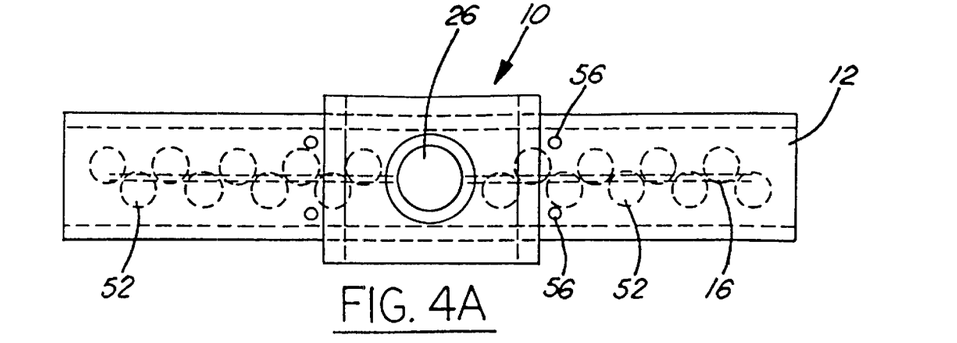
FIG. 4A is a top view of the present invention flexible die head having a pressure means of springs mounted thereto.
Figure 4B:
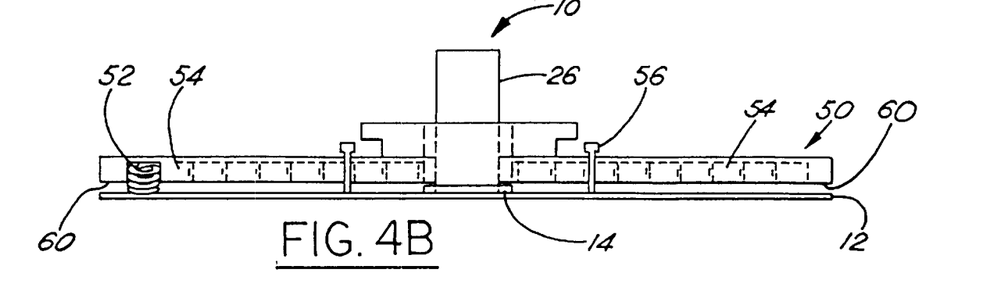
FIG. 4B is a side view of the present invention flexible die head having, a pressure means of springs mounted thereto.

FIGS. 4A, 4B, 5A and 5B illustrate the present invention novel flexible die head in combination with a pressure means. In FIGS. 4A and 4B, a top view and a side view of the present invention flexible die head 10 having a pressure means 50 of a plurality of mechanical springs 52 mounted thereto are shown. The pressure means 50 is attached to the die head 12 by mechanical means 56, i.e., such as bolts. An uniform pressing force along a full eight inch or twelve inch wide flexible die head 12 can be supplied by a linear array of a plurality of springs 52. The construction of the pressing means 50 can be of any convenient mechanical method. For instance, the springs 52 may be individually seated in blind holes 54 that are provided in the bottom surface 60 of the pressing means 50. It has been observed that, depending on the curvature of the mold surface, some springs 52 may be compressed more than the others, similar to an application of bed springs.

Figure 5A:
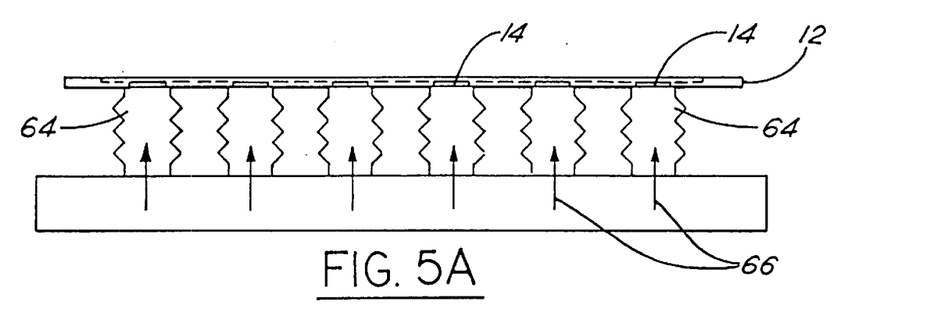
FIG. 5A is a side view of the present invention flexible die head having a pressure means of bellows mounted thereto.
Figure 5B:
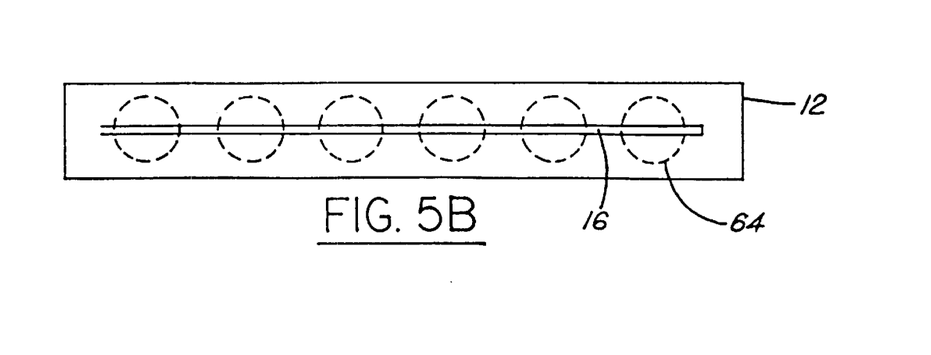
FIG. 5B is a bottom view of the present invention flexible die head having a pressure means of bellows mounted thereto.

FIGS. 5A and 5B show a second embodiment of the pressing means 50 of a plurality of stainless steel bellows 64. The bellows 64 function both as mechanical springs and solder supply tubes wherein solder supply 66 enters the bellow 64 and then exits through a plurality of gate openings 14. This configuration is especially suitable when a modified wave soldering tool is utilized to carry out the present invention method.

It has been found that molds used for a flip-chip solder bumping process usually have aspect ratios of 0.5, i.e., the depth is half the width. At such shallow aspect ratios, the leading edge of incoming molten solder pushes the air out of the cavity ahead of the solder flow front. A pliable Teflon seal 70 (shown in FIG. 6A) allows the air to escape, but not the solder. The present invention novel method therefore does not require the evacuation of cavities having large aspect ratios, i.e., larger than one, as that normally required in the conventional injection molded solder molds for instance, for molding solder columns in column grid arrays (CGA). The present invention molten solder screening technique is therefore suitable for filling cavities that have aspect ratios smaller than one, or for filling cavities that have aspect ratios between about 1:1 and about 1:10.

The present invention molten solder screening technique does not require the use of vacuum to evacuate cavities and to initiate a solder feed. As a consequence, there is no need for a vacuum slot or a vacuum link. The present invention novel method therefore eliminates the problem in conventional methods of a cross-leak of molten solder into a vacuum passage. The present invention technique feeds a molten solder to a slot opening through a gate opening while the molten solder is under a pressure of between about 2 psi and about 5 psi. The positive pressure can be provided by an inert gas such as nitrogen, which is connected to a solder reservoir (as shown in FIG. 1A). Alternatively, the positive pressure can be supplied by a variable speed solder pump (not shown) as that typically used in a wave soldering tool. To develop the positive pressure, there should be no solder bypass between the solder pump and the flexible die head unless the desired pressure has been reached. Alternatively, a pressure safety valve may be included which opens at pressures exceeding 5 psi. The fluid communication between the solder pump (not shown) and the present invention flexible die head is achieved by supplying molten solder from a die head which is positioned under a mold, as shown in FIG. 5A.

Figure 6:
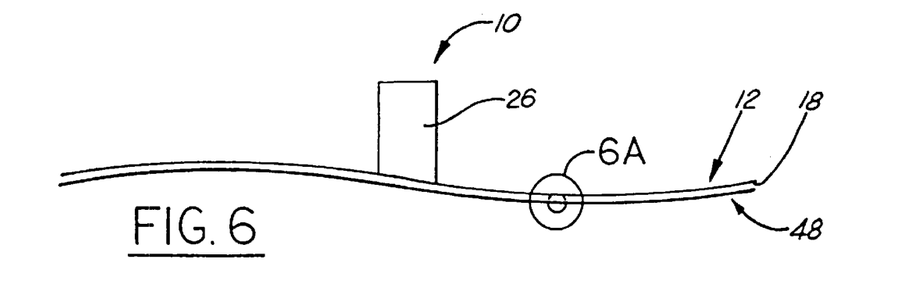
FIG. 6 is a schematic illustrating a side view of the present invention flexible die head that is globally flexible.
Figure 6A:
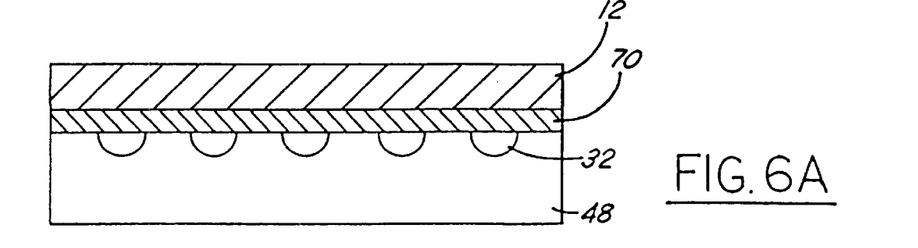
FIG. 6A is a partially enlarged, cross-sectional view of FIG. 6 illustrating the engagement between the flexible die head and the mold.

The present invention novel flexible die head which is globally flexible and locally rigid is further illustrated in FIGS. 6 and 6A. FIG. 6A is an enlarged, cross-sectional view of a section of FIG. 6. The present invention novel flexible die head utilizes stainless steel as a non-wetting head material. The thickness of the die body 12 can be suitably controlled within a range between about 0.025" and about 0.045" and thus providing sufficient flexibility on a global scale of the whole width of a wafer. On the bottom surface 18 of the die body 12, a slot opening 16 (shown in FIG. 1A) is cut to a width of between about 1/32" and about 1/8", and preferably to a width of about 1/16". The depth of the slot opening 16 is cut into the die body 12 to between about 0.010" and about 0.020", and preferably to about 0.015". The length of the slot opening 16 is slightly larger than the widest part of an etched area of a glass mold plate. The length therefore can be either about 8" or 12" depending on the size of the wafer to be solder bumped.

In an alternate embodiment of the present invention, to further assist the sliding motion of the flexible die head on the glass mold plate and to avoid damages to the mold surface a Teflon® coating is added to the bottom surface 18 of the die body 12. A suitable thickness of the Teflon® coating is between about 0.005" and about 0.010" which includes the thickness of an adhesive backings After a Teflon® tape 70 is applied to the bottom surface 18 of the die head 12, the slot opening 16 in the die body 12 is cut into the Teflon® tape 70 such that solder may flow freely along the entire length of the opening 16. When a Teflon® tape of 0.010" thickness is used, the depth of the slot opening 16 is increased to a total depth of approximately 0.025". It has been found that at such a depth, molten solder flows readily along the entire length of the slot opening 16 under a positive pressure of about 3 psi~5 psi. The Teflon® tape 70 provides improved lubricity property to the surface of the die body 12 and thus eliminating possible scratching or other damages to the surface of the glass mold 48. The soft Teflon® tape 70 further provides the benefit that it embeds any hard particles on the surface of the glass mold 48, and thus preventing damages to the mold surface. The Teflon® tape 70 further provides the benefit that it reduces drag on the mold surface to ensure a smooth scanning of the flexible die head.

During an excess solder removal process from the surface of the glass mold, the Teflon® tape 70 on the die body 12 does not affect the molten solder deposited in the cavities since molten solder does not wet Teflon®. The pliable Teflon® tape 70 on the die body 12 further assists the removal, or the wiping, process of excess solder from the surface of the mold plate. A typical operating head joining pressure, i.e., the pressure between the Teflon® tape and the glass mold surface, is between about 15 psi and about 25 psi which is supplied by the plurality of springs or bellows, as shown in FIGS. 4A~5B. The Teflon® tape 70, even though pliable, is still hard enough as not to disturb, or to scoop out molten solder from the cavities that were previously filled.

After the cavities 32, as shown in FIGS. 2 and 6A, are completely filled, the mold plate 48 is cooled to allow the molten solder in the cavities 32 to solidify. The mold plate 4S, complete with filled cavities is then ready for the next processing step for transferring solder bumps onto a solder receiving surface on an electronic device. This is shown in FIGS. 7A~7D. A transfer of solder bumps to an electronic device can be accomplished by a fixture lid 72 and a flat base member 74. Onto the flat base member 74, it is desirable that a compressible material layer 76 such as a polymeric based foam layer is placed to ensure an improved mating between the mold surface and the solder receiving surface on the electronic device. The compressible material layer 76 should be manufactured of a high temperature endurant material, i.e., up to the reflow temperature of the solder bumps at about 220° C. On top of the compressible material layer 76, the electronic structure 78 is positioned with a plurality of bond pads 82 in a faced-up position. Alternatively, a thin layer of a flux material (not shown) can be dispersed over the bond-pad side of the electronic structure 78. It is possible to transfer the solder bumps 80 without using a flux coating by subjecting the bumps 80 to a proper reducing atmosphere in the solder transfer furnace.

Figure 7A:
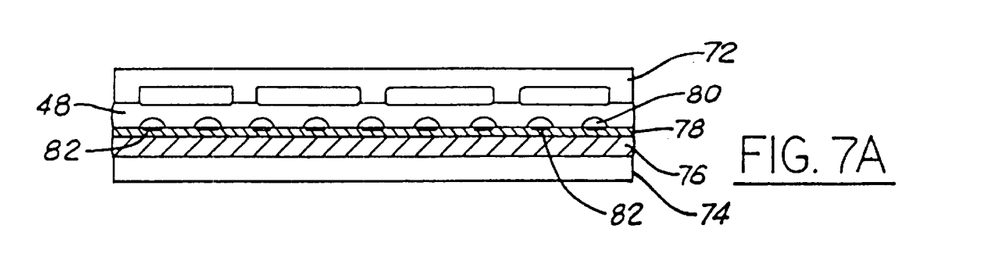
FIG. 7A is a cross-sectional view of the present invention solder transfer apparatus.

During the solder transfer process, as shown in FIG. 7A, the solder-filled mold plate 48 is aligned to and positioned over the electronic structure 78 with the solder bumps 80 facing the corresponding bond pads 82. To ensure a successful operation of the present invention novel method, the alignment process for the solder bumps 80 to the bond pads 82 is important. The fixture lid 72 is placed on the back side of the mold plate 48 and a small compression force is applied between the fixture lid 72 and the base member 74 such that the compressible material layer 76 is slightly compressed. The fact that the electronic structure 78, i.e., may be a silicon wafer, and the mold plate 48 are slightly flexible further ensures that an intimate contact between the two members over the entire surface area is achieved. The fixture assembly 86 is then positioned into a reflow furnace (not shown) which is typically a belt furnace. The temperature of the fixture assembly 86 is then increased to a temperature that is not less than the reflow temperature of the solder material, i.e., about 220° C., and then cooled down to the room temperature upon exiting from the furnace.

Figure 7B:
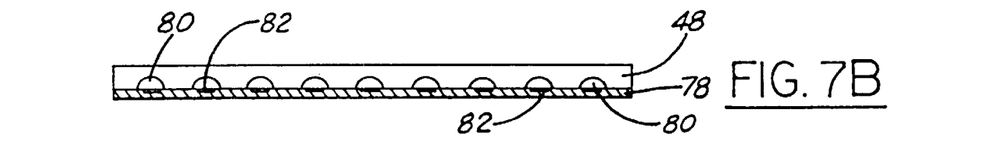
FIG. 7B is a cross-sectional view of the present invention mold having solder bumps filled therein intimately engaging a solder receiving surface on an electronic device.
Figure 7C:
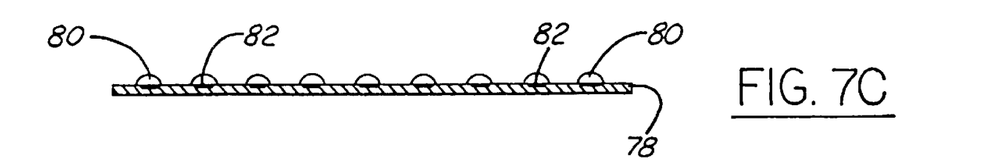
FIG. 7C is a cross-sectional view of the solder receiving surface on the electronic device after the solder bumps are transferred thereto.
Figure 7D:
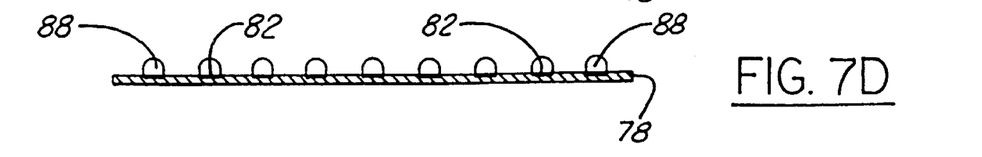
FIG. 7D is a cross-sectional view of the solder receiving surface on the electronic device and the solder bumps after a reflow process.

As shown in FIG. 7B, after the solder bump transfer process is completed in the furnace, the electronic structure 78 and the mold plate 48 are removed from the fixture assembly 86. The mold plate 48, after cooled to a temperature below the melting point of the solder material, i.e., about 183° C., can be removed-from the surface of the electronic structure 78. This is shown in FIG. 7C. The solder bumps 80 are now metallurgically bonded to the bond pads 82 on the surface of the electronic structure 78. Alternatively, as shown in FIG. 7D, a final reflow process of the solder bumps 80 can be conducted such that full solder spheres 88 are formed.

The solder material used in forming the solder bumps may be suitably selected from a composition range between about 58% tin/42% lead and about 68% tin/32% lead, a typical example is a eutectic 63% tin/37% lead solder composition having a melting point of about 183° C. for use in the present invention novel method. The present invention molten solder screening technique may also utilize any other solder compositions, including those lead-free alloys which have become increasingly popular in various semiconductor applications.

INDUSTRIAL APPLICABILITY

The present invention novel method and apparatus can be easily adapted in various industrial fabrication methods for electronic devices. For instance, the method can be practiced in a stationary face-up mold method, in a moving face-up mold method, in a moving face-down mold method or in any other suitable methods.

In a stationary face-up mold method, the molds do not move and are positioned with a surface that has etched cavities facing up. A present invention novel flexible die head can be used to scan across the top surface of the mold plate. This mode of operation is relatively easy to implement since the molds can be simple placed on a support plate that is either heated or cooled, and then the flexible die head is used to scan across a heated mold plate. The novel flexible die head of the present invention consists of a central solder reservoir that is under a nitrogen pressure to supply molten solder to a slot opening through a gate opening under the nitrogen pressure. This has been shown in FIGS. 1A~2. The drawback of this mode of operation is that it requires the handling of the molds before and after each solder fill by placing them onto or removing them from a heating/cooling plate, it may be labor intensive and thus costly for a manufacturing process.

Figure 8:
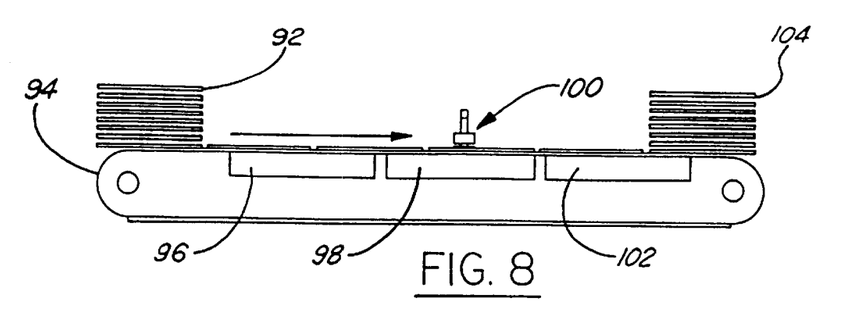
FIG. 8 is an illustration of the present invention solder bump molding process utilizing a flexible die head and a moving face-up mold.

In a moving face-up mold operation, mold plates move with their etched cavity side facing up. A present invention flexible die head is mounted in a stationary position to scan over the top of the mold transported on a moving belt. This mode of operation is more compatible with a manufacturing process. Since the mold plates move relative to a stationary flexible die head, the mold plates may be pre-heated as they move closer to the solder fill location and then, cooled after the solder fill A schematic illustrating this mode of operation is shown in FIG. 8. Unfilled mold plates 92 are moved on a moving belt 94 through a pre-heat station 96, a heating station 98 under a flexible die head 100, and then to a cooling station 102 before it is removed from the belt 94 as filled molds 104. As shown in FIG. 8, this mode of operation allows molds to be filled sequentially as is frequently seen in manufacturing processes.

Figure 9A:
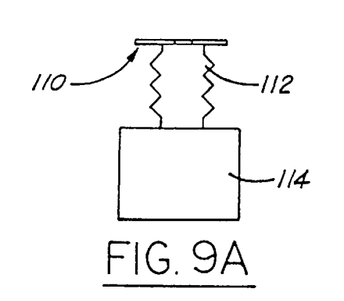
FIG. 9A is an illustration of the present invention flexible die head having, a pressure means of bellows in an uncompressed state.
Figure 9B:
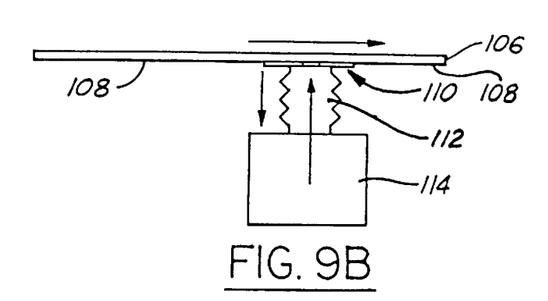
FIG. 9B is an illustration of the present invention flexible die head being compressed by a pressure means of bellows onto a face-down mold.

In a moving face-down mode operation, as shown in FIGS. 9A and 9B, molds 106 move on a conveyor belt (not shown) with an etched cavity side 108 facing downwardly. A flexible die head 110 remains stationary to scan the bottom surface 108 of the mold 106. In this mode of operation, a wave soldering tool can be modified for running the process. For instance, the solder supply nozzle can be modified to supply solder through a flexible stainless steel bellow 112 which receives a molten solder supply from a solder pump 114. At the upper end of the bellow 112, a present invention flexible die head 110 is mounted as an interface between the bellow 112 and the mold plate 106. The desirable benefits of the present invention novel flexible die head is fully utilized to allow an intimate contact between the die head and with the bottom surface 108 of the mold plate 106 to be achieved. This allows all the cavities positioned in the bottom surface 108 to be completely filled With the molten solder fed from the solder pump 114 under a small positive pressure. As shown in FIG. 9B, the bellow is slightly compressed as the mold plate 106 scans over the flexible die head 110. The compressibility of the bellows therefore further improves the joining between the flexible die head and the mold plate under a small pressure. This mode of operation therefore incorporates the same desirable manufacturing benefits of the moving face-up mold operation method, while an existing Wave soldering tool can be modified to carry out the process.

The advantages of the present invention molten solder screening technique become more apparent when the size of mold plates that can be filled is considered. The conventional injection molded solder technique can only fill cavities that are shorter than the length of the vacuum link between a vacuum slot and a solder slot. The present invention novel method overcomes that limitation based on the fact that a vacuum link is not required for the process. Furthermore, the present invention flexible die head can be made wider than the width of the entire mold that is being scanned. For example, a molten solder screening tool can have a flexible die head that is 12" wide which is capable of scanning substrates (or molds) of either 12" or 8". A 12" wide flexible die head can therefore be used to scan any molds that are smaller than 12", as long as the carrier holding the parts has an adjustable width. Thus, even chip-sized molds of 1" or 2" widths could be scanned with a 12" tool provided that the solder slot is cut to a length less than the mold width. This is readily adjustable by cutting only the Teflon® tape to the appropriate length. However, a preferred embodiment is where the length of the flexible die head matches the mold width.

The in-situ filling of substrates with sequentially patterned layers may have significant applications in low-cost packaging processes. Such applications may include consumer electronics and automotive electronics. Even though the present invention technique utilizes molten solders, which do not have resistivities as lows as copper or gold, they should suffice for many industrial applications that do not require high-quality conductive layers. When the present invention technique is used on organic-natured circuit boards, solder materials in the range of eutectic 63% Sn/37% Pb melting points should be used. When the present invention method is used on etched silicon or glass without the presence of polymers, substantially higher temperature molten metals can be used in forming the conductive components.

Furthermore, the present invention molten solder screening technique can be applied to either transfer molds that are used for transferring solder bumps to a final solder receiving surface, or to circuit boards directly. Since the present invention method does not require a seal between a liquid solder source and a receiving layer, the flatness of the receiving layer is not a requirement. The flexible die head of the present invention and the use of its trailing edge as a wiper readily accommodates organic circuit boards that may have substantial warpage without affecting the effectiveness of wiping. Unlike the conventional method of wave soldering which relies on surface tension for forming a maximum solder height, the molten solder screening technique can build solder structures to any desirable height by filling sequentially deposited and patterned layers into cavities. In most applications, these layers may remain in place for forming a multi-layered electrical redistribution structure. Some other applications may remove layers forming the depressions which receive the molten solder or metal, and thus leaving free-standing metal structures. The present invention apparatus, in its broadest form of application functions similarly as a 3-D stereolithography apparatus capable of producing metal parts.

The present invention novel method and apparatus for forming solder bumps by a molten solder screening technique have therefore been amply demonstrated in the above descriptions and the appended drawings of FIGS. 1A~9B. It should be noted that the present invention novel method and apparatus can be advantageously used in forming solder bumps on any electronic structure, even though a silicon wafer has been used to demonstrate the process. The present invention novel method may further utilize any solder materials including those desirable lead-free solder materials that have been properly used recently in the semiconductor industry.

While the present invention has been described in an illustrative manner, it should be understood that the terminology used is intended to be in a nature of words of description rather than a limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows:

1. An apparatus for filling a multiplicity of cavities positioned in the surface of a substrate with a molten solder comprising:
    a stream of molten solder,
    a die member constructed of a metal sheet capable of flexing at least 1.5 µm per inch of die length for said stream of molten solder to flow therethrough,
    a pressure means for engaging said multiplicity of cavities in the surface of the substrate with a surface of the stream such that a predetermined pressure is maintained between said multiplicity of cavities and said stream surface, and
    a solder removal means for removing excess molten solder from the surface of the substrate.

2. An apparatus for filling a multiplicity of cavities according to claim 1, wherein said metal sheet having a thickness of not larger than 0.045".

3. An apparatus for filling a multiplicity of cavities according to claim 1, wherein said multiplicity of cavities having an aspect ratio of between 1:1 and 1:10.

4. An apparatus for filling a multiplicity of cavities according to claim 1, wherein said substrate being constructed of a material having a coefficient of thermal expansion similar to that of a final solder receiving material.

5. An apparatus for filling a multiplicity of cavities according to claim 1, wherein said solder removal means for removing excess molten solder from the surface of the substrate is a wiper formed by a trailing edge of a metal die.

6. An apparatus for filling a multiplicity of cavities according to claim 2, wherein said multiplicity of cavities having an aspect ratio of between 1:1 and 1:10.

7. An apparatus for filling a multiplicity of cavities according to claim 2, wherein said substrate being constructed of a material having a coefficient of thermal expansion similar to that of a final solder receiving material.

8. An apparatus for filling a multiplicity of cavities according to claim 2, wherein said solder removal means for removing excess molten solder from the surface of the substrate is a wiper formed by a trailing edge of a metal die.

\* \* \* \* \*